(12) United States Patent
Tsai et al.

(10) Patent No.: US 10,971,606 B2
(45) Date of Patent: Apr. 6, 2021

(54) METHOD FOR MANUFACTURING SEMICONDUCTOR DEVICE

(71) Applicant: TAIWAN SEMICONDUCTOR MANUFACTURING CO., LTD., Hsinchu (TW)

(72) Inventors: Ming-Heng Tsai, Taipei (TW); Chun-Sheng Liang, Changhua County (TW); Kuo-Hua Pan, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/504,727

(22) Filed: Jul. 8, 2019

(65) Prior Publication Data

US 2019/0334013 A1 Oct. 31, 2019

Related U.S. Application Data

(62) Division of application No. 15/484,474, filed on Apr. 11, 2017, now Pat. No. 10,347,750.

(Continued)

(51) Int. Cl.
| | |
|---|---|
| *H01L 21/00* | (2006.01) |
| *H01L 29/66* | (2006.01) |
| *H01L 29/78* | (2006.01) |
| *H01L 27/108* | (2006.01) |
| *H01L 27/088* | (2006.01) |

(Continued)

(52) U.S. Cl.
CPC .... *H01L 29/6681* (2013.01); *H01L 29/66545* (2013.01); *H01L 29/66795* (2013.01); *H01L 29/7851* (2013.01); *H01L 21/845* (2013.01); *H01L 27/0886* (2013.01); *H01L 27/10879* (2013.01); *H01L 29/41791* (2013.01); *H01L 29/785* (2013.01)

(58) Field of Classification Search
CPC ......... H01L 29/66545; H01L 29/66795; H01L 29/785; H01L 21/823431; H01L 29/42392
See application file for complete search history.

(56) References Cited

U.S. PATENT DOCUMENTS 8,310,013 B2 * 11/2012 Lin ................... H01L 29/66795
257/401
8,809,131 B2 * 8/2014 Bangsaruntip .... H01L 29/42392
438/142

(Continued)

*Primary Examiner* — Nicholas J Tobergte
(74) *Attorney, Agent, or Firm* — McClure, Qualey & Rodack, LLP

(57) ABSTRACT

A method for manufacturing a semiconductor device includes forming a shallow trench isolation (STI) structure surrounding a pair of semiconductor fins; forming a dummy gate layer over the STI structure and the semiconductor fins; etching a first portion of the dummy gate layer to form a trench through the dummy gate layer until the STI structure is exposed, in which the trench extends between the semiconductor fins along a lengthwise direction of the semiconductor fins; forming an insulating structure in the trench through the dummy gate layer; after forming the insulating structure extending through the dummy gate layer, patterning the dummy gate layer to form a pair of dummy gate structures each of which is across a respective one of the semiconductor fins; and replacing the dummy gate structures with a pair of metal gate structures.

20 Claims, 13 Drawing Sheets

Related U.S. Application Data

(60) Provisional application No. 62/426,809, filed on Nov. 28, 2016.

(51) Int. Cl.
*H01L 21/84* (2006.01)
*H01L 29/417* (2006.01)

(56) References Cited

U.S. PATENT DOCUMENTS

| | | |
|---|---|---|
| 9,461,044 B1 | 10/2016 | Chang |
| 9,472,470 B2 * | 10/2016 | Cheng ................. H01L 29/7848 |
| 9,601,492 B1 | 3/2017 | Deng et al. |
| 9,917,020 B2 | 3/2018 | Liu et al. |
| 2009/0095980 A1 * | 4/2009 | Yu ....................... H01L 27/1211 |
| | | 257/190 |
| 2010/0118599 A1 | 5/2010 | Marshall et al. |
| 2012/0132989 A1 * | 5/2012 | Haensch ............ H01L 29/0673 |
| | | 257/347 |
| 2014/0061794 A1 * | 3/2014 | Cheng ................. H01L 29/7851 |
| | | 257/347 |
| 2015/0025557 A1 | 1/2015 | Kim et al. |
| 2016/0111420 A1 | 4/2016 | Zhang et al. |
| 2016/0133632 A1 | 5/2016 | Park et al. |
| 2017/0256457 A1 | 9/2017 | Deng et al. |
| 2018/0158739 A1 | 6/2018 | Liu et al. |
| 2018/0350692 A1 | 12/2018 | Deng et al. |

* cited by examiner

METHOD FOR MANUFACTURING SEMICONDUCTOR DEVICE

PRIORITY CLAIM AND CROSS-REFERENCE

The present application is a Divisional Application of the U.S. application Ser. No. 15/484,474, filed Apr. 11, 2017, now U.S. Pat. No. 10,347,750, issued Jul. 9, 2019, which claims priority to U.S. Provisional Application Ser. No. 62/426,809, filed Nov. 28, 2016, the entirety of which is incorporated by reference herein.

BACKGROUND

As the semiconductor industry has progressed into nanometer technology process nodes in pursuit of higher device density, higher performance, and lower costs, challenges from both fabrication and design issues have resulted in the development of three dimensional designs, such as a fin-like field effect transistor (FinFET). A FinFET includes an extended semiconductor fin that is elevated above a substrate in a direction substantially normal to the plane of the substrate. The channel of the FET is formed in this semiconductor fin. A gate is provided over (e.g., wrapping) the semiconductor fin. The FinFETs further can reduce the short channel effect.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A to 8A are perspective views of a method for manufacturing a semiconductor device at various stages in accordance with some embodiments of the present disclosure.

FIGS. 1B to 8B are cross-sectional views taking along lines B-B of FIGS. 1A to 8A.

FIGS. 9A to 12A are perspective views of a method for manufacturing a semiconductor device at various stages in accordance with some embodiments of the present disclosure.

FIGS. 9B to 12B are cross-sectional views taking along lines B-B of FIGS. 9A to 12A.

DETAILED DESCRIPTION

Figure 1A:
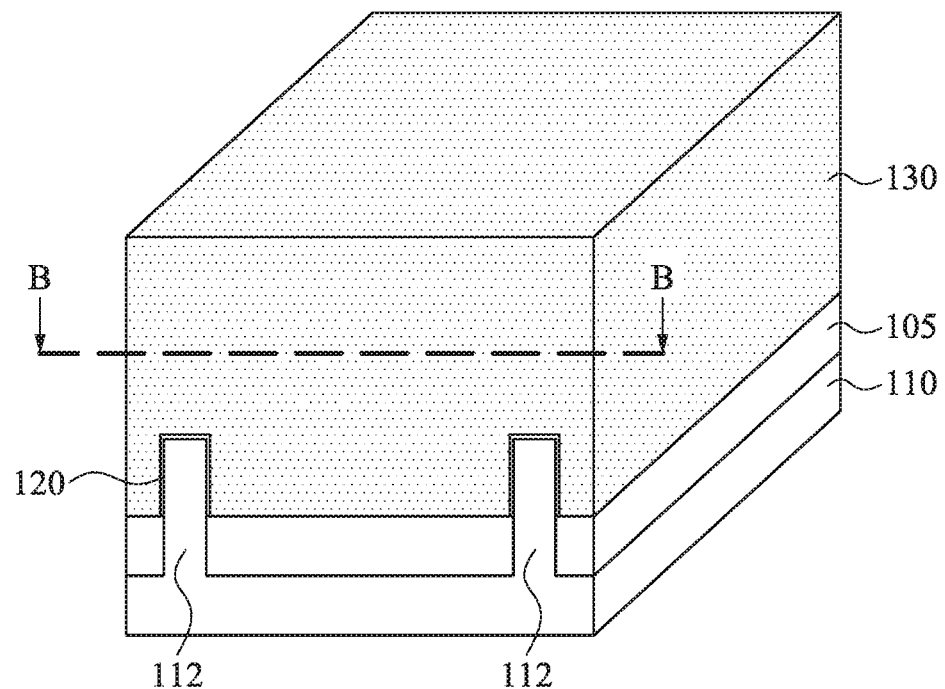

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the present disclosure provide some methods for the formation of semiconductor devices and the resulting structures. These embodiments are discussed below in the context of forming finFET transistors having a single fin or multiple fins on a semiconductor substrate. One of ordinary skill in the art will realize that embodiments of the present disclosure may be used with other configurations.

Figure 1B:
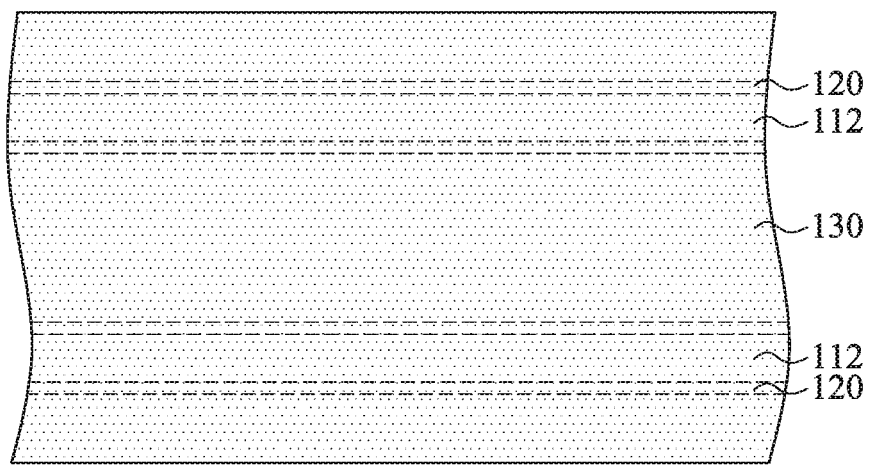

FIGS. 1A to 8A are perspective views of a method for manufacturing a semiconductor device at various stages in accordance with some embodiments of the present disclosure, and FIGS. 1B to 1B are cross-sectional views taking along lines B-B of FIGS. 1A to 8A. Reference is made to FIGS. 1A and 1B. A substrate 110 is provided. The substrate 110 includes at least one semiconductor fin 112 protruded from the substrate 110. For example, in FIGS. 1A and 1B, the substrate 110 includes two semiconductor fins 112. It is note that the number of the semiconductor fins 112 in FIGS. 1A and 1B is illustrative, and should not limit the claimed scope of the present disclosure. A person having ordinary skill in the art may select suitable numbers for the semiconductor fins 112 according to actual situations.

In some embodiments, the substrate 110 includes silicon. Alternatively, the substrate 110 may include germanium, silicon germanium, gallium arsenide or other appropriate semiconductor materials. Also alternatively, the substrate 110 may include an epitaxial layer. For example, the substrate 110 may have an epitaxial layer overlying a bulk semiconductor. Further, the substrate 110 may be strained for performance enhancement. For example, the epitaxial layer may include a semiconductor material different from that of the bulk semiconductor, such as a layer of silicon germanium overlying bulk silicon or a layer of silicon overlying bulk silicon germanium. Such strained substrate may be formed by selective epitaxial growth (SEG). Furthermore, the substrate 110 may include a semiconductor-on-insulator (SOI) structure. Also alternatively, the substrate 110 may include a buried dielectric layer, such as a buried oxide (BOX) layer, such as that formed by separation by implantation of oxygen (SIMOX) technology, wafer bonding, SEG, or other appropriate method.

The semiconductor fins 112 may be formed, for example, by patterning and etching the substrate 110 using photolithography techniques. In some embodiments, a layer of photoresist material (not shown) is deposited over the substrate 110. The layer of photoresist material is irradiated (exposed) in accordance with a desired pattern (the semiconductor fins 112 in this case) and developed to remove a portion of the photoresist material. The remaining photoresist material protects the underlying material from subsequent processing steps, such as etching. It should be noted that other masks, such as an oxide or silicon nitride mask, may also be used in the etching process.

In some other embodiments, the semiconductor fins 112 may be epitaxially grown. For example, exposed portions of an underlying material, such as an exposed portion of the substrate 110 may be used in an epitaxial process to form the semiconductor fins 112. A mask may be used to control the shape of the semiconductor fins 112 during the epitaxial growth process.

The substrate 110 further includes isolation structures 105. The isolation structures 105, which act as shallow trench isolations (STIs) around the semiconductor fins 112, may be formed by chemical vapor deposition (CVD) techniques using tetra-ethyl-ortho-silicate (TEOS) and oxygen as a precursor. In some other embodiments, the isolation structures 105 may be formed by implanting ions, such as oxygen, nitrogen, carbon, or the like, into the substrate 110. In yet some other embodiments, the isolation structures 105 are insulator layers of a SOI wafer.

In FIG. 1B, a plurality of gate insulator layers 120 are respectively formed on the semiconductor fins 112. The gate insulator layers 120, which prevent electron depletion, may include, for example, a high-k dielectric material such as metal oxides, metal nitrides, metal silicates, transition metal-oxides, transition metal-nitrides, transition metal-silicates, oxynitrides of metals, metal aluminates, zirconium silicate, zirconium aluminate, or combinations thereof. Some embodiments may include hafnium oxide ($HfO_2$) hafnium silicon oxide (HfSiO), hafnium silicon oxynitride (HfSiON), hafnium tantalum oxide (HfTaO), hafnium titanium oxide (HfTiO), hafnium zirconium oxide (HfZrO), lanthanum oxide (LaO), zirconium oxide (ZrO), titanium oxide (TiO), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), silicon nitride ($Si_3N_4$), oxynitride (SiON), and combinations thereof. The gate insulator layers 120 may have a multilayer structure such as one layer of silicon oxide (e.g., interfacial layer) and another layer of high-k material. The gate insulator layers 120 may be formed using thermal oxide, chemical vapor deposition (CVD), physical vapor deposition (PVD), atomic layer deposition (ALD), ozone oxidation, other suitable processes, or combinations thereof.

A dummy layer 130 is formed on the substrate 110 to cover the gate insulator layers 120 and the semiconductor fins 112. In other words, the gate insulator layers 120 are disposed between the dummy layer 130 and the substrate 110. In some embodiments, the dummy layer 130 includes a semiconductor material such as polysilicon, amorphous silicon, or the like. The dummy layer 130 may be deposited doped or undoped. For example, in some embodiments the dummy layer 130 includes polysilicon deposited undoped by low-pressure chemical vapor deposition (LPCVD). The polysilicon may also be deposited, for example, by furnace deposition of an in-situ doped polysilicon. Alternatively, the dummy layer 130 may includes other suitable materials.

Figure 2A:
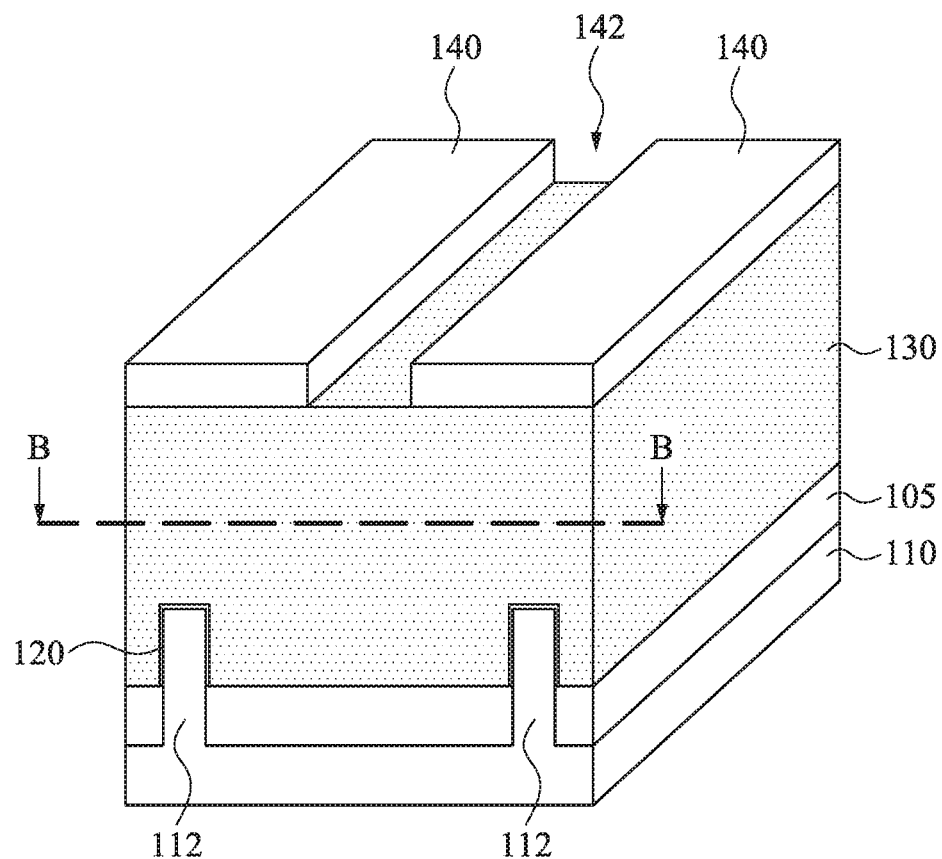
Figure 2B:
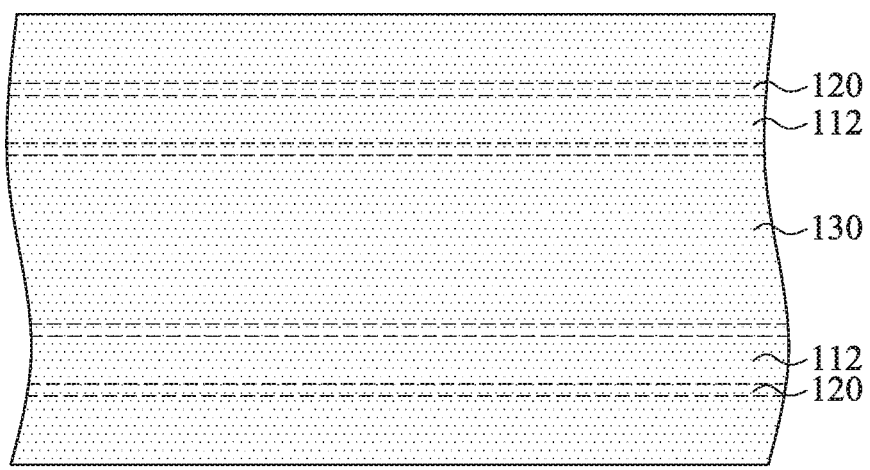
Figure 6A:
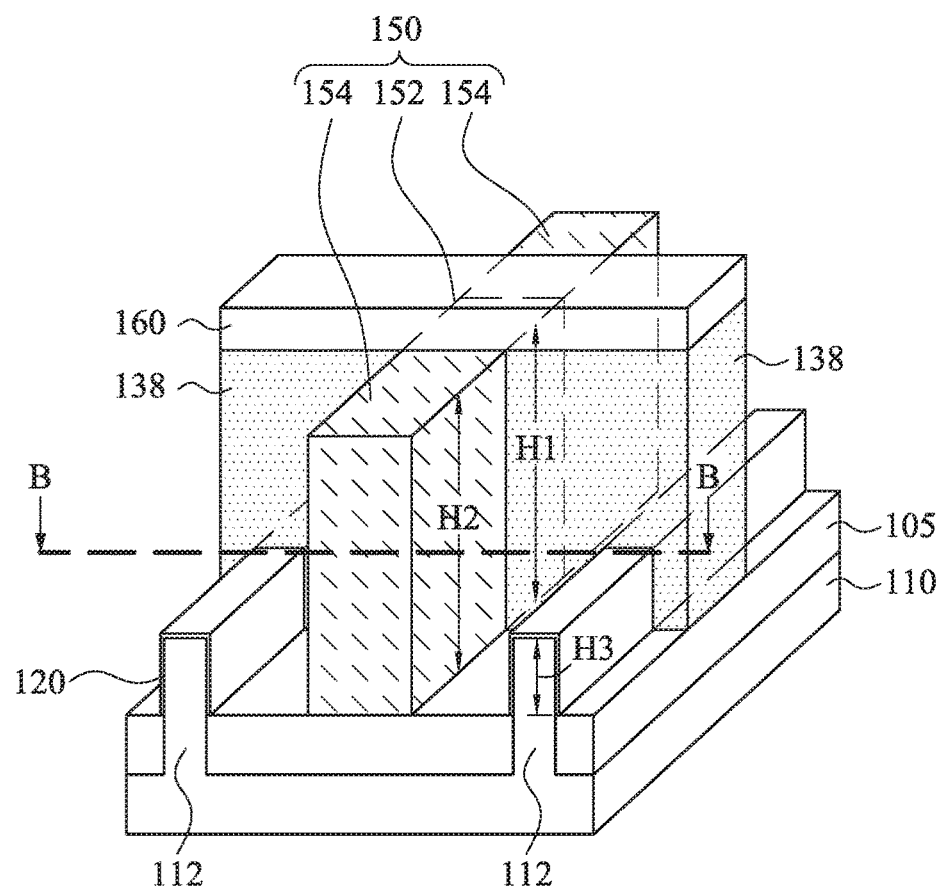
Figure 6B:
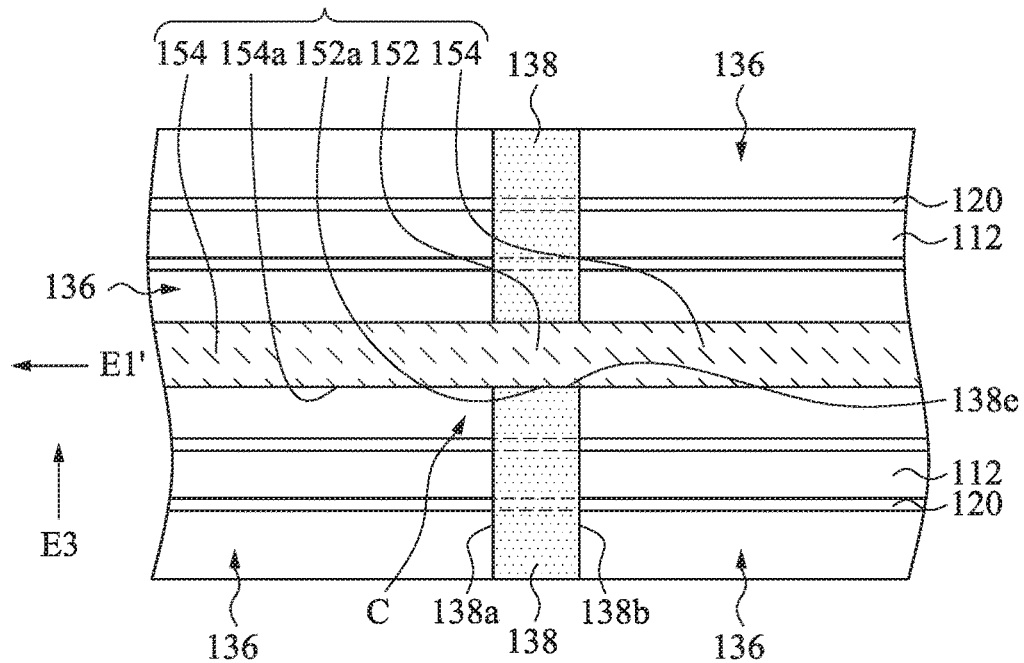

Reference is made to FIGS. 2A and 2B. A mask 140 is formed on the dummy layer 130 and is patterned to define an insulation area 142, i.e., to define ends of gates (as shown in FIGS. 6A and 6B). In some embodiments, the mask 140 is a photoresist mask formed by depositing, exposing, and developing a layer of photoresist material. The mask 140 is patterned to form the insulation area 142 between the gates in subsequent processing steps as discussed in greater detail below. It should be noted that other masks, such as an oxide or silicon nitride mask, may also be used in the etching process.

Figure 3A:
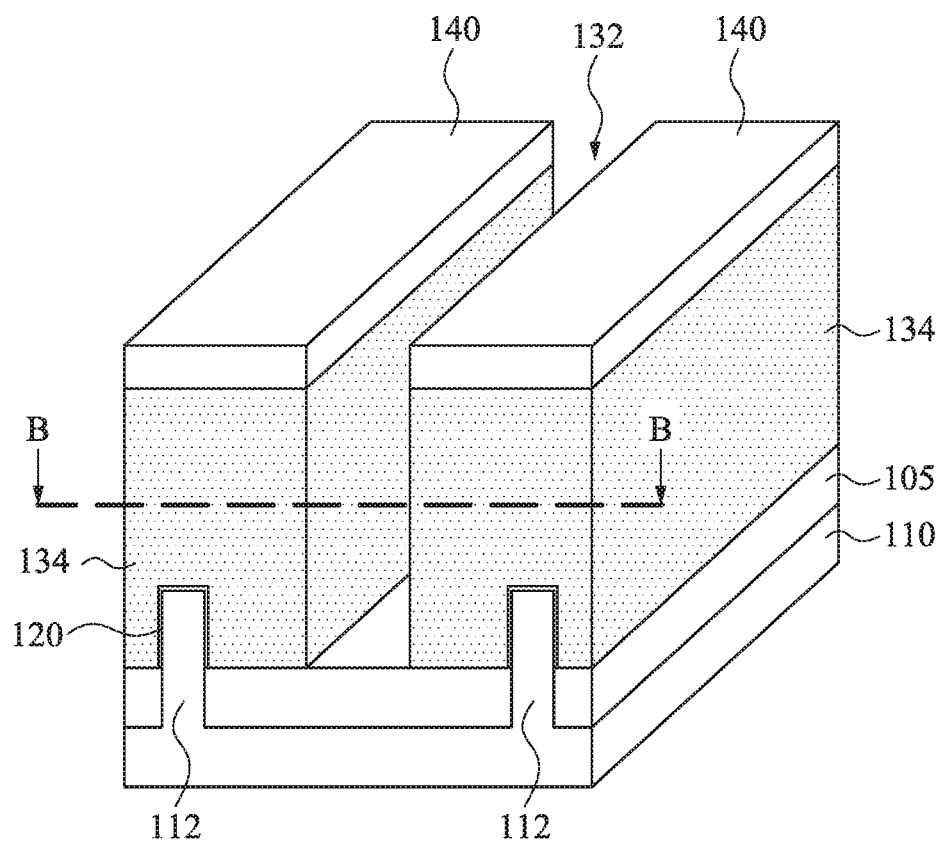
Figure 3B:
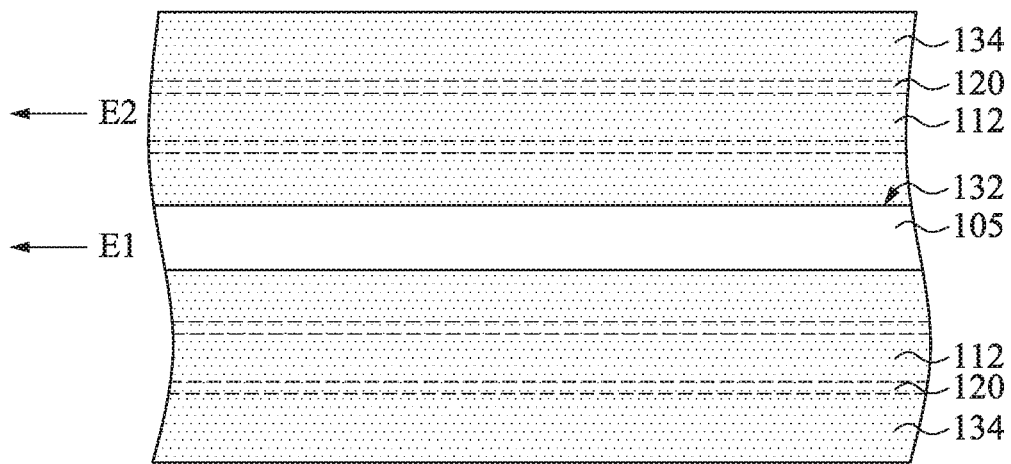

Reference is made to FIGS. 3A and 3B. The dummy layer 130 (see FIGS. 2A and 2B) is removed (or patterned) in the regions exposed by the mask 140 by an etching back process or other suitable process to form a trench 132 and at least one dummy strip 134 adjacent to the trench 132. For example, the trench 132 is formed between two of the dummy strips 134 as shown in FIG. 3A. The dummy layer 130 may be selectively etched thereby forming the trench 132. In some embodiments, the trench 132 has an extension direction E1 substantially parallel to the extension direction E2 of the semiconductor fins 112. The exposed portions of the dummy layer 130 may be removed by an anisotropic etch process that contains fluorine-based etching gas, and/or other suitable biased methods. The terms "substantially" as used herein may be applied to modify any quantitative representation which could permissibly vary without resulting in a change in the basic function to which it is related.

Figure 4A:
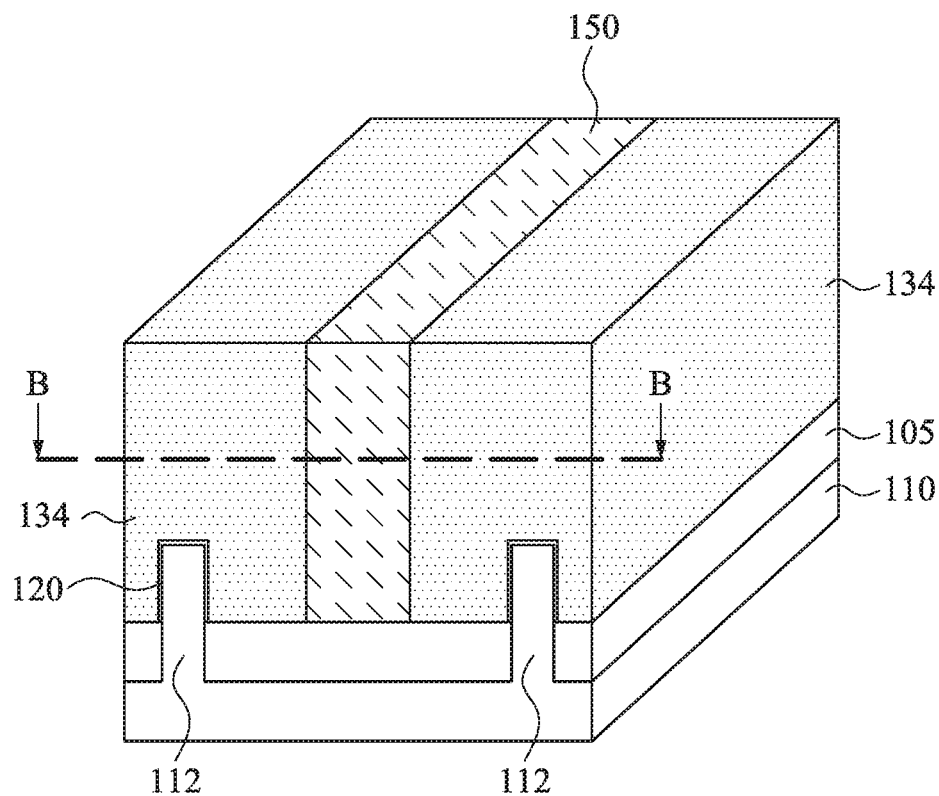
Figure 4B:
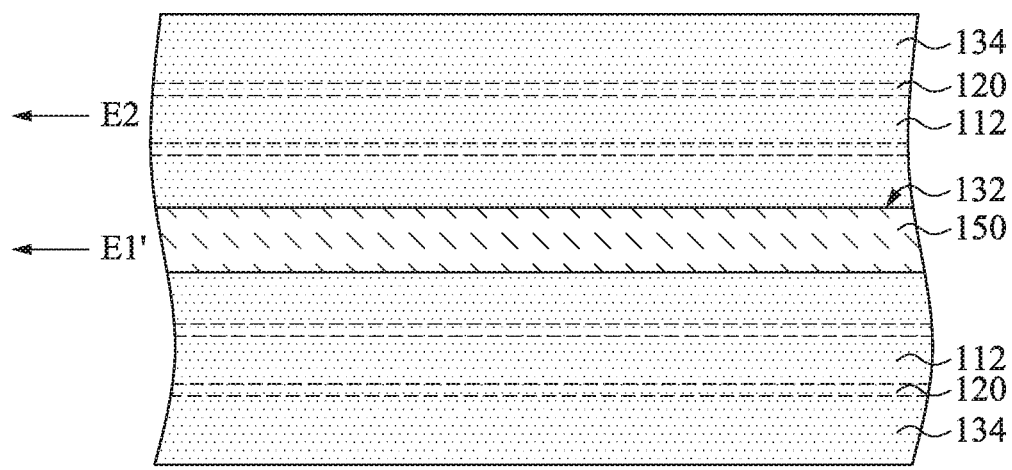

Reference is made to FIGS. 4A and 4B. Removal of the mask 140 of FIG. 3A before dielectric deposition in the trench is optional. In some embodiments, the mask 140 is removed by performing a wet etching process. In some embodiments, wet etch solution for the wet etching process includes sulfuric acid ($H_2SO_4$) and peroxide ($H_2O_2$). Alternatively, the mask 140 is removed by a chemical solution selected from $O_3$ water, sulfuric acid ($H_2SO_4$) and ozone ($O_3$), $H_2SO_4$ and $H_2O_2$, N-methyl-2-pyrrolidine (NMP), cyclohexanol, cyclopentanol, propylene glycol monomethyl ether (PGME), and propylene glycol monomethyl ether acetate (PGMEA). In some other embodiment, the mask 140 is removed by a chemical solution selected from oxidant based solution. In some embodiments, a cleaning process is performed to clean residues after the removal of the mask 140. The cleaning material may include solvent, surfactant or polymer ingredient.

An insulating structure 150 is disposed in the trench 132. For example, an inter-layer dielectric (ILLS) (not shown) is formed in the trench 132 and on the dummy strips 134. In some embodiments, the ILD is formed of an oxide such as phospho-silicate glass (PSG), born-silicate glass (BSG), boron-doped phospho-silicate glass (BPSG), tetraethyl orthosilicate (TEOS), or nitride-like dielectric such as atomic layer deposition (ALD) SiN, or the like. A CMP process may then be performed to etch back and planarize the ILD to form the insulating structure 150.

In FIG. 4B, the insulating structure 150 has an extension direction E1' substantially parallel to the extension direction E2 of the semiconductor fins 112. In other words, the insulating structure 150 is substantially parallel to the semiconductor fins 112. In some embodiments, the insulating structure 150 is disposed between adjacent two of the semiconductor fins 112, as shown in FIGS. 4A and 4B. Furthermore, the insulating structure 150 is separated from the semiconductor fins 112.

Figure 5A:
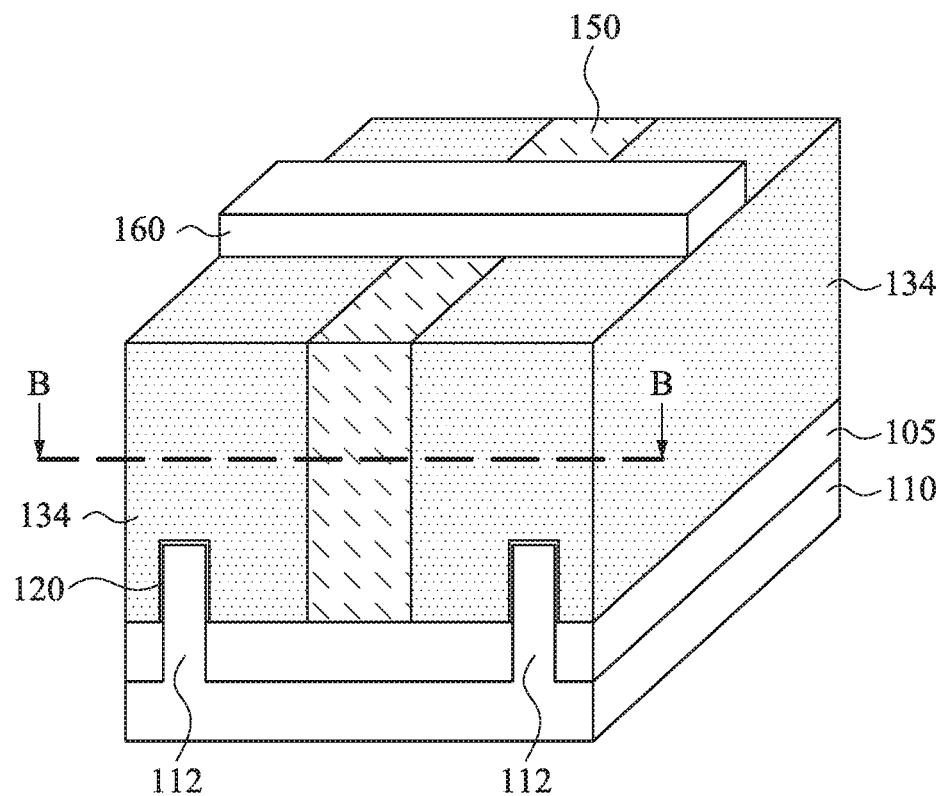
Figure 5B:
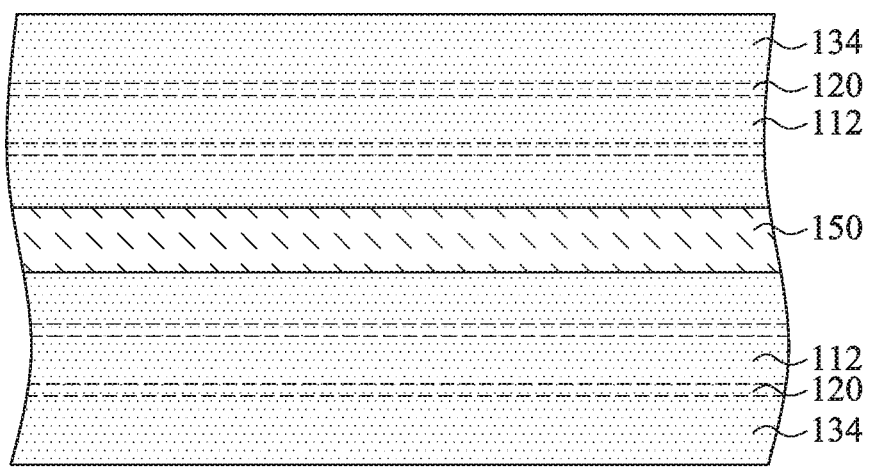

Reference is made to FIGS. 5A and 5B. Another mask 160 is formed on the dummy strips 134 and the insulating structure 150 and is patterned to define gates. In some embodiments, the mask 160 is a photoresist mask formed by depositing, exposing, and developing a layer of photoresist material. It should be noted that other masks, such as an oxide or silicon nitride mask, may also be used in the etching process. The mask 160 and the mask. 140 of FIG. 2A may have the same or different materials.

Reference is made to FIGS. 6A and 6B. The dummy strips 134 (see FIGS. 5A and 5B) are removed (or patterned) in the regions exposed by the mask 160 by an etching back process or other suitable process to form at least one opening 136 and at least one gate 138 adjacent to the opening 136. For example, a plurality of the openings 136 and a plurality of gates 138 are formed as shown in FIGS. 6A and 6B. The openings 136 expose the semiconductor fins 112. The dummy strips 134 may be selectively etched thereby forming the openings 136. In some embodiments, at least one of the gates 138 has an extension direction E3 in crossing with the extension direction E1' of the insulating structure 150. For example, the extension direction E3 is substantially perpendicular to the extension direction E1'. The exposed portions of the dummy strips 134 may be removed by a wet etch process that includes exposure to hydroxide containing solution (e.g., ammonium hydroxide), deionized water, and/ or other suitable etchant solutions.

In FIGS. 6A and 6B, the insulating structure 150 includes at least one first portion 152 and at least one second portion 154. For example, the insulating structure 150 of FIGS. 6A and 6B includes a first portion 152 and a plurality of second portions 154, the first portion 152 is disposed between the second portions 154, and the present disclosure is not limited in this respect. The first portion 152 is disposed beneath the mask 160, such that the first portion 152 is disposed adjacent to and between the gates 138. That is, the first portion 152 of the insulating structure 150 is in contact with the gates 138. The second portions 154 are exposed by the mask 160, such that the second portions 154 are disposed adjacent to the openings 136. In FIG. 6A, the first portion 152 of the insulating structure 150 has a height H1, and the second portion 154 of the insulating structure 150 has a height H2. The heights H1 and H2 are substantially the same. Furthermore, the heights H1 and H2 are greater than a height H3 of the semiconductor fin 112 protruding from the isolation structures 105.

In FIG. 6B, at least one of the gates 138 has a first sidewall 138a, a second sidewall 138b, and at least one end sidewall 138e. The second sidewall 138b is opposite to the first sidewall 138a, and the end sidewall 138e is connected to the first sidewall 138a and the second sidewall 138b. The end sidewall 138e faces the insulating structure 150 and is separated from the semiconductor fins 112. The first sidewall 138a and the second sidewall 138b of the gate 138 across the semiconductor fin 112. The first portion 152 of the insulating structure 150 has a sidewall 152a facing one of the gates 138, and the second portion 154 of the insulating structure 150 has a sidewall 154a facing the same gate 138. The end sidewall 138e of the gate 138 is in contact with the sidewall 152a of the first portion 152 of the insulating structure 150 while leaves the sidewall 153b of the second portion 154 of the insulating structure 150 uncovered. In other words, the first portion 152 of the insulating structure 150 is adjacent to the end sidewall 138e of the gate 138, and the second portion 154 of the insulating structure 150 is connected to the first portion 152 of the insulating structure 150 and extends past the first sidewall 138b of the gate 138. In some embodiments, another of the second portion 154 of the insulating structure 150 extends past the second sidewall 138a of the gate 138. That is, the insulating structure 150 and one of the gates 138 resemble a shape of T. One of the gates 138 and one of the second portions 154 of the insulating structure 150 form a corner C therebetween. In some embodiments, the corner C has an angle of substantially 90 degrees.

Since the trench 132 of FIGS. 3A and 3B is formed before the formation of the gates 138, the trench 132 can be defined to have a long length, such that an aspect ratio of the trench 132 is reduced, which provides large window for depositing the insulating structure 150. As such, the deposition of the insulating structure 150 can be improved. Furthermore, since trench 132 has a long length, the sidewall of the trench 132 (i.e., the sidewalls 152a and 154a) is substantially straight, such that the end sidewalls 138e of the gates 138 are substantially vertical rather than rounded. Moreover, since the aspect ratio of the trench 132 is reduced, the critical dimension of the trench 132 (also the insulating structure 150) can be reduced, which means less dielectric refilling in the trench 132. The configuration of the insulating structure 150 in FIGS. 6A and 6B is independent on the sizes (or the lengths) of the gates 138. The insulating structure 150 can provide good isolation between the gates 138 even the gates 138 have smaller dimensions and avoid the gates 138 being short.

Figure 7A:
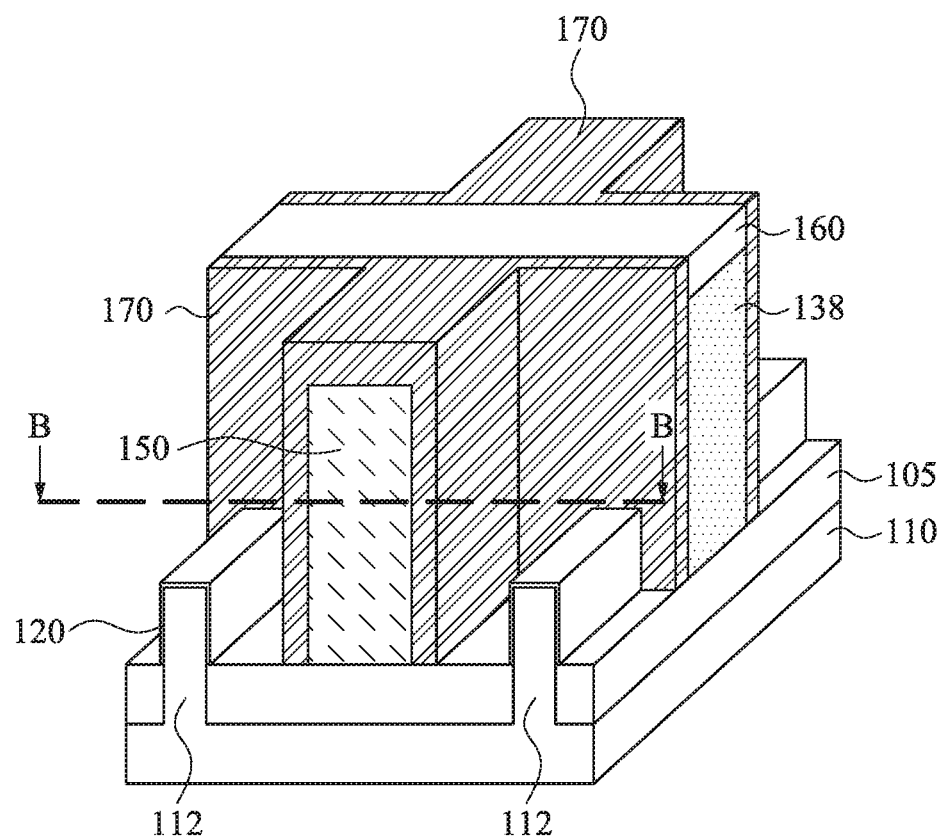
Figure 7B:
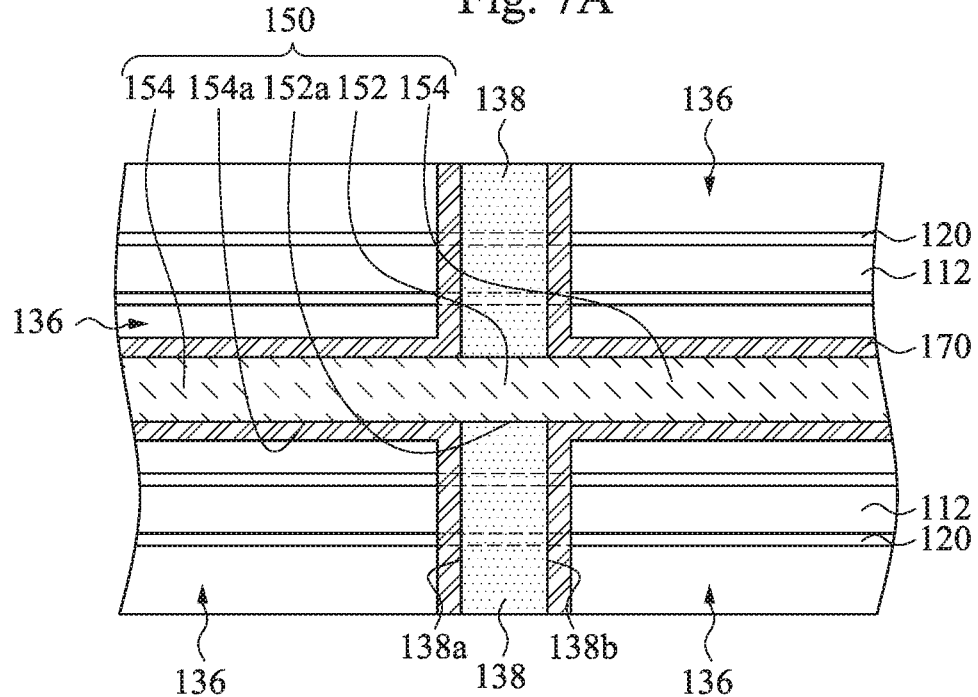

Reference is made to FIGS. 7A and 7B, A plurality of gate spacers 170 are formed on opposing sidewalk of the gates 138 and the insulating structure 150. In some embodiments, at least one of the gate spacers 170 includes single or multiple layers. The gate spacers 170 can be formed by blanket depositing one or more dielectric layer(s) (not shown) on the previously formed structure. The dielectric layer(s) may include silicon nitride (SiN), oxynitride, silicon carbon (SiC), silicon oxynitride (SiON), oxide, and the like and may be formed by methods utilized to form such a layer, such as CVD, plasma enhanced CVD, sputter, and other methods known in the art. The gate spacers 170 may include different materials with different etch characteristics than the gates 138 so that the gate spacers 170 may be used as masks for the removing of the gate 138 in a replacement gate process. The gate spacers 170 may then be patterned, such as by one or more etches to remove the portions of the gate spacers 170 from the horizontal surfaces of the gates 138 and the mask 160.

In FIGS. 7A and 7B, the gate spacers 170 are disposed adjacent to the gates 138 and the insulating structure 150. In greater detail, the gate spacers 170 are in contact with the first sidewall 138a/second sidewall 138b of the gates 138 and the sidewalls 154a of the second portions 154 of the insulating structure 150. Portions of the gate spacers 170 are further disposed on the second portions 154 of the insulating structure 150 as shown in FIG. 7A. An interface (i.e., the sidewall 154a) is formed between the second portion 154 of the insulating structure 150 and the gate spacer 170. The gate spacers 170 surround the insulating structure 150.

In some embodiments, portions of the semiconductor fins 112 exposed by the gates 138 can be removed, and a plurality of epitaxy structures can be formed on opposite sides of the gates. In some other embodiments, the formation of epitaxy structures can be omitted.

Figure 8A:
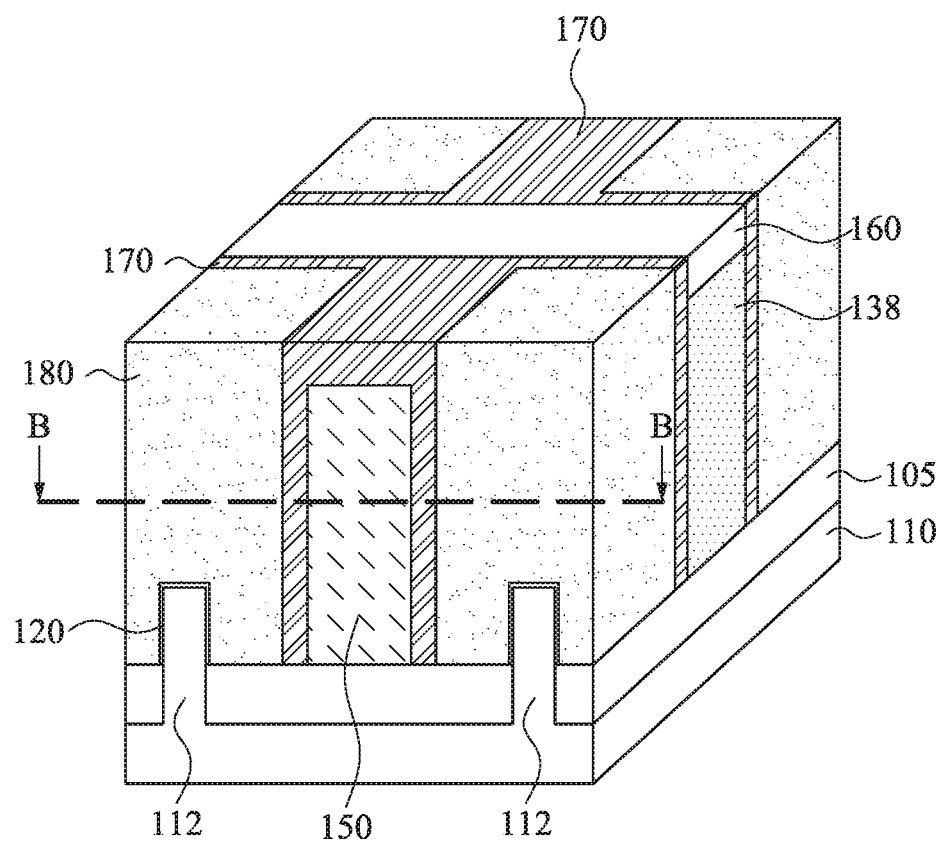
Figure 8B:
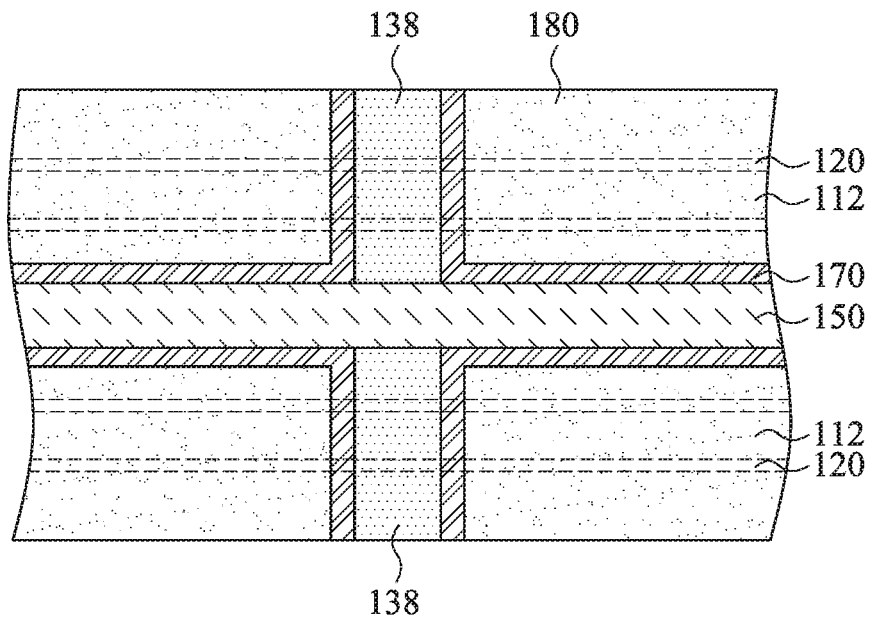

Reference is made to FIGS. 8A and 8B. A dielectric layer 180 is formed at outer sides of the gate spacers 170 on the substrate 110. The dielectric layer 180 includes silicon oxide, oxynitride or other suitable materials. The dielectric layer 180 includes a single layer or multiple layers. The dielectric layer 180 is formed by a suitable technique, such as CVD or ALD. A chemical mechanical planarization (CMP) process may be applied to remove excessive dielectric layer 180 and expose the top surface of the mask 160 to the following process. The gate spacers 170 separates the insulating structure 150 and the dielectric layer 180.

In some embodiments, a replacement gate (RPG) process scheme is employed. In a RPG process scheme, a dummy gate (such as the gate 138 in this ease) is formed first and is replaced later by a metal gate after high thermal budget processes are performed. The gates 138 may be removed to form openings with the gate spacers 170 as their sidewalls.

In some embodiments, portions of the gate insulating layers 120 exposed by the openings are removed as well. Alternatively, in some embodiments, the gates 138 are removed while the gate insulating layers 120 retains. The gates 138 (and the gate insulating layers 120) may be removed by dry etch, wet etch, or a combination of dry and wet etch. For example, a wet etch process may include exposure to a hydroxide containing solution (e.g., ammonium hydroxide), deionized water, and/or other suitable chant solutions.

Thereafter, additional processes may be performed to manufacture the semiconductor device. For example, the metal gate may be doped, portions of the metal gate may be silicided, inter-layer dielectric (ILD) layers/and inter-metal dielectric (IMD) layers may be formed, metallization layers may be formed, and the like.

Figure 9A:
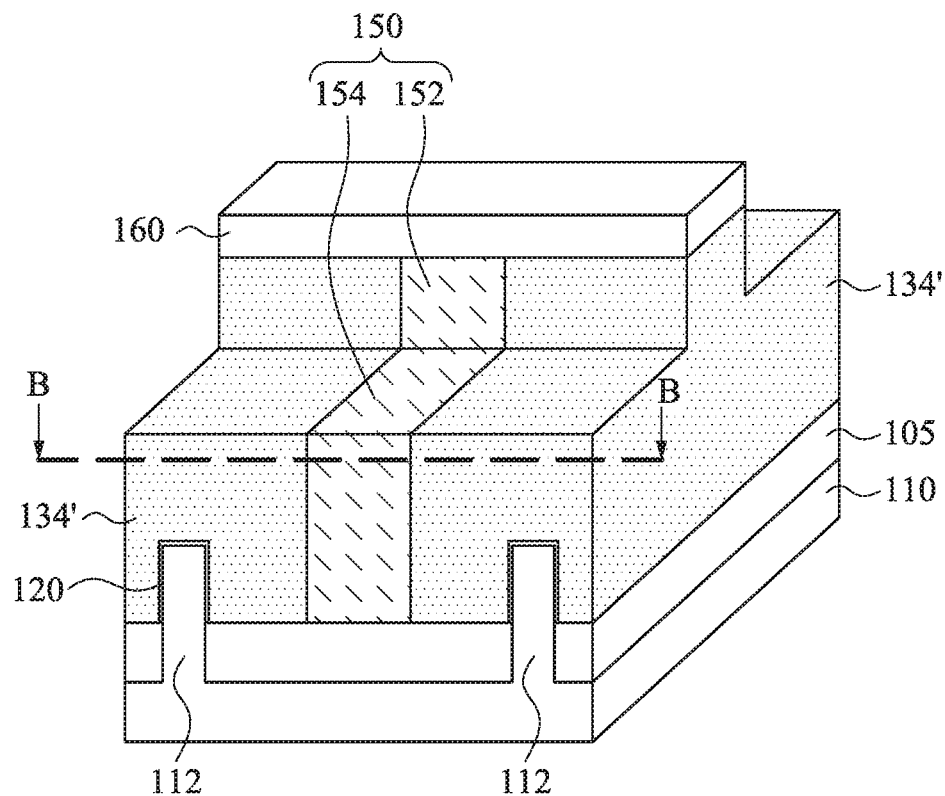
Figure 9B:
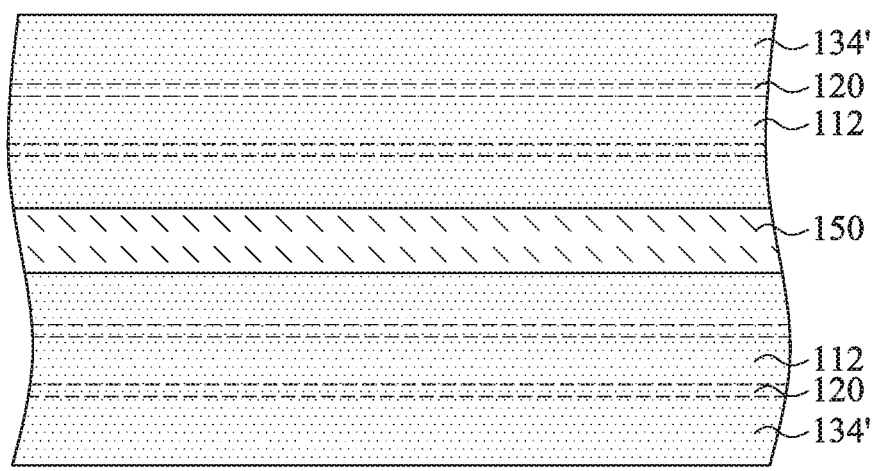

FIGS. 9A to 12A are perspective views of a method for manufacturing a semiconductor device at various stages in accordance with some embodiments of the present disclosure, and FIGS. 9B to 12B are cross-sectional views taking along lines B-B of FIGS. 9A to 12A. Reference is made to FIGS. 9A and 9B. The manufacturing processes of FIGS. 1A-5B are performed in advance. Since the relevant manufacturing details are similar to FIGS. 1A-5B, and, therefore, a description in this regard will not be repeated hereinafter. The dummy strips 134 (see FIGS. 5A and 5B) and the insulating structure 150 are partially removed (or partially patterned) in the regions exposed by the mask 160 by an etching back process or other suitable process to reduce the heights of the second portions 154 of the insulating structure 150 and the exposed dummy strips 134. The portions of the dummy strips 134 and the insulating structure 150 can be removed by a non-selective etching process (one that does not distinguish between the dummy strips 134 and the insulating structure 150). In some embodiments, the non-selective etching process can be performed by fine-tuned chlorine- or fluorine-based dry etching, or low selectivity CMP process, and the present disclosure is not limited in this respect.

Figure 10A:
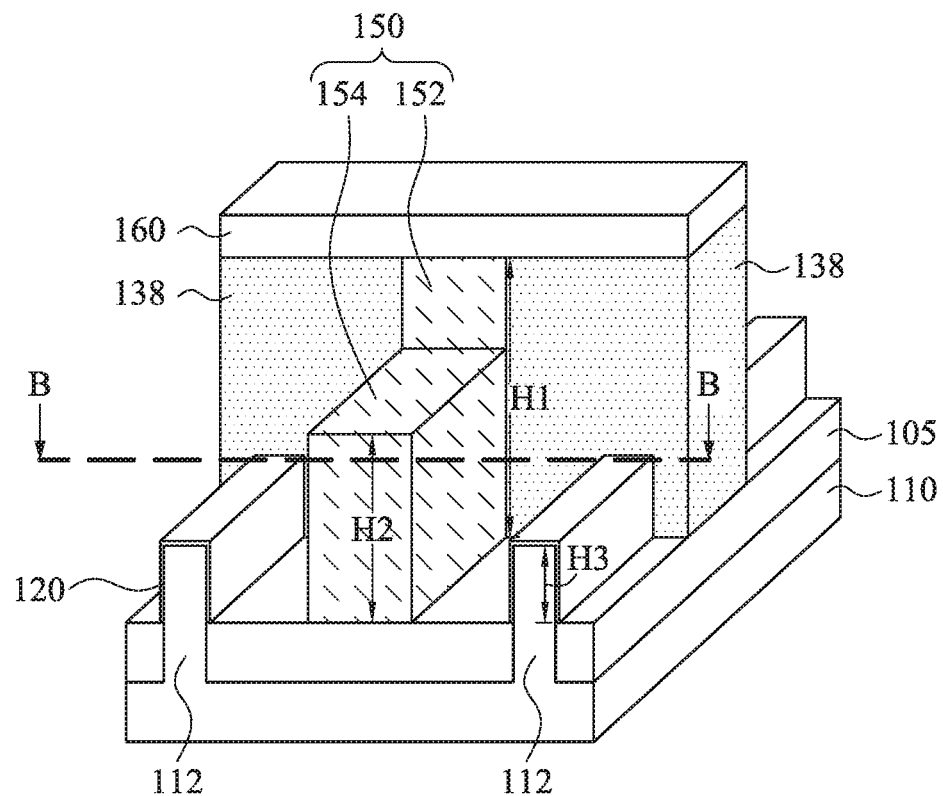
Figure 10B:
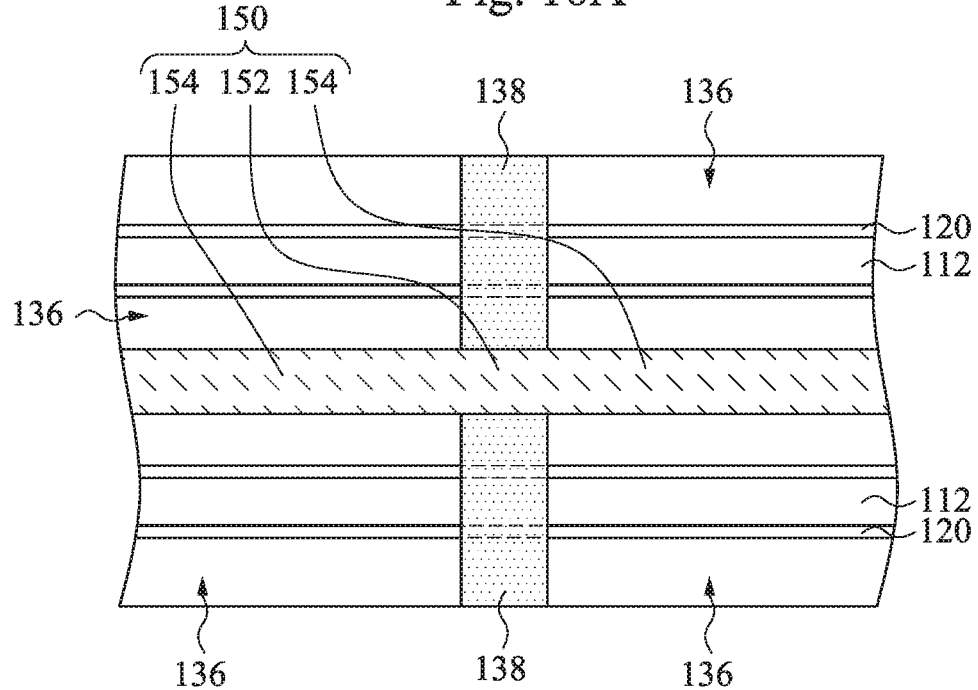

Reference is made to FIGS. 10A and 10B. The remaining dummy strips 134' (see FIGS. 9A and 9B) are removed (or patterned) in the regions exposed by the mask 160 by an etching back process or other suitable process to form at least one opening 136 and at least one gate 138 adjacent to the opening 136. For example, a plurality of the openings 136 and a plurality of gates 138 are formed as shown in FIGS. 10A and 10B. The openings 136 expose the semiconductor fins 112. The dummy strips 134 may be selectively etched thereby forming the openings 136. The exposed portions of the dummy strips 134 may be removed by a wet etch process that includes exposure to hydroxide containing solution (e.g., ammonium hydroxide), deionized water, and/or other suitable etchant solutions.

In FIG. 10A, the first portion 152 of the insulating structure 150 has a height H1, and the second portion 154 of the insulating structure 150 has a height H2. The heights H1 and H2 are different. In greater detail, the height H1 is greater than the height H2. Furthermore, the heights H1 and H2 are greater than the height H3 of the semiconductor fin 112 protruding from the isolation structures 105. With such configuration, the gate spacers 170 (see FIGS. 11A and 11B) can be deposited easily if the openings 136 have high aspect ratios.

Figure 11A:
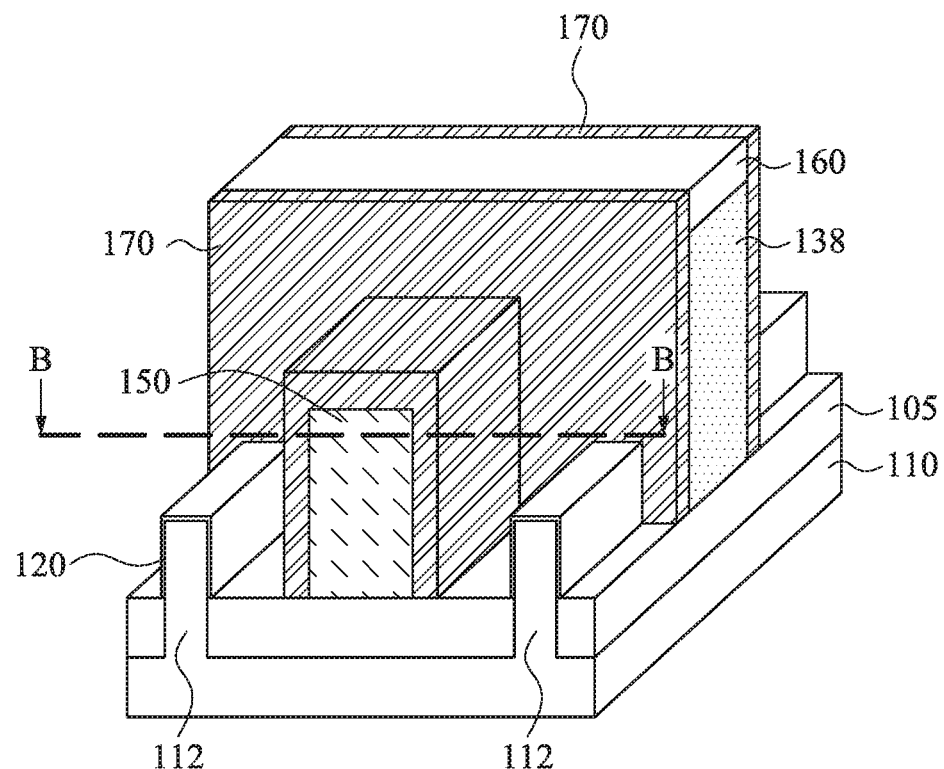
Figure 11B:
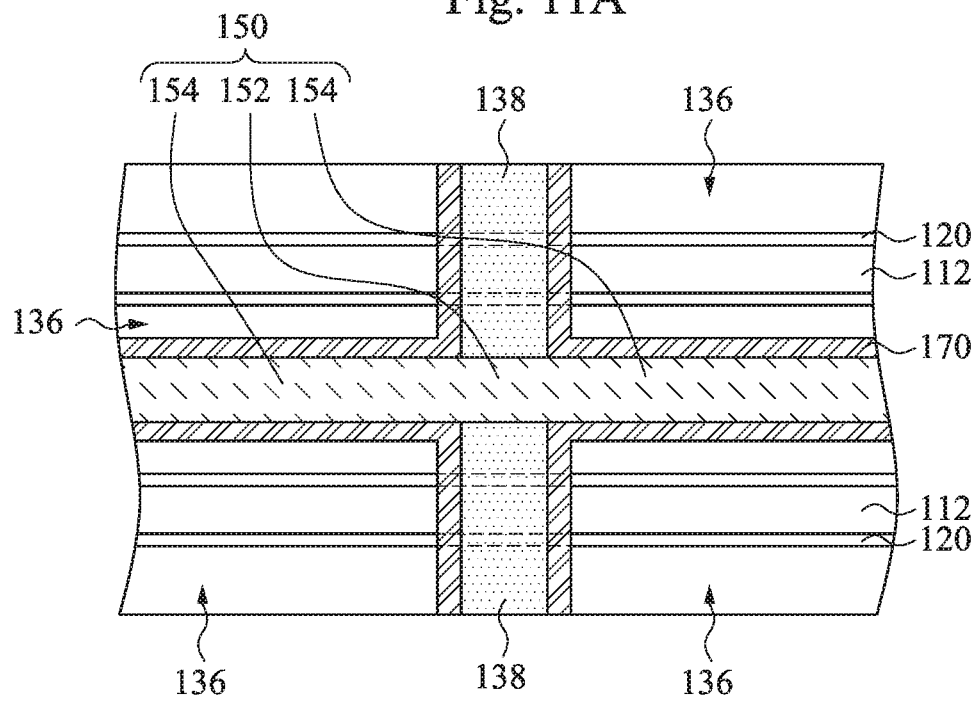

Reference is made to FIGS. 11A and 11B. A plurality of gate spacers 170 are formed on opposing sidewalk of the gates 138 and the insulating structure 150. In some embodiments, at least one of the gate spacers 170 includes single or multiple layers. The gate spacers 170 can be formed by blanket depositing one or more dielectric layer(s) (not shown) on the previously formed structure. The dielectric layer(s) may include silicon nitride (SiN), oxynitride, silicon carbon (SiC), silicon oxynitride (SiON), oxide, and the like and may be formed by methods utilized to form such a layer, such as CVD, plasma enhanced CVD, sputter, and other methods known in the art. The gate spacers 170 may include different materials with different etch characteristics than the gates 138 so that the gate spacers 170 may be used as masks for the removing of the gate 138 in a replacement gate process. The gate spacers 170 may then be patterned, such as by one or more etches to remove the portions of the gate spacers 170 from the horizontal surfaces of the gates 138 and the mask 160.

In some embodiments, portions of the semiconductor fins 112 exposed by the gates 138 can be removed, and a plurality of epitaxy structures can be formed on opposite sides of the gates. In some other embodiments, the formation of epitaxy structures can be omitted.

Figure 12A:
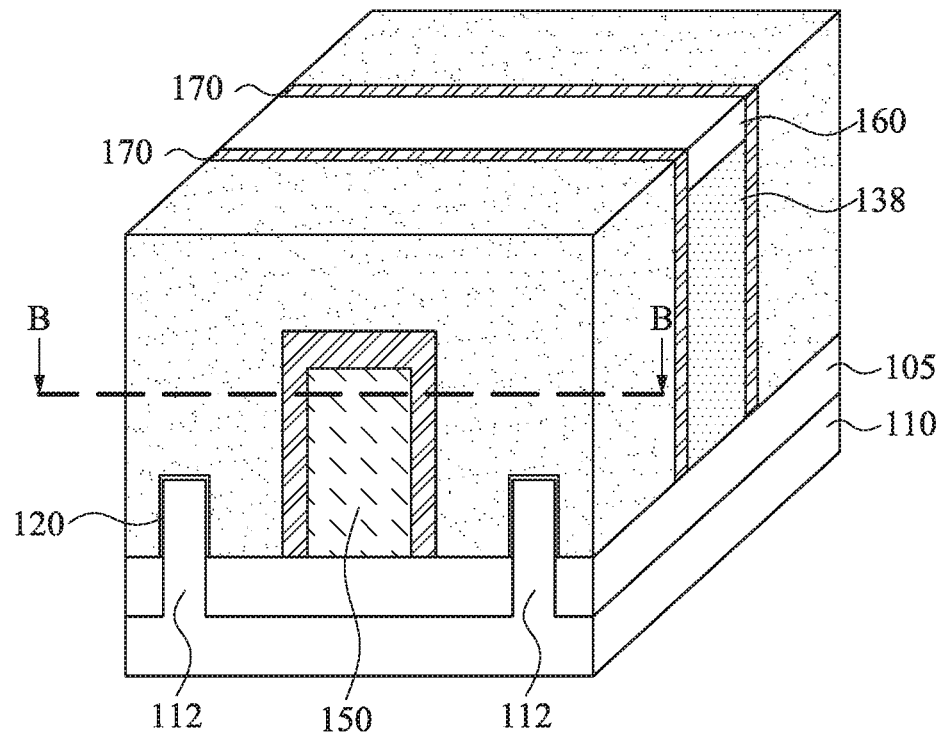
Figure 12B:
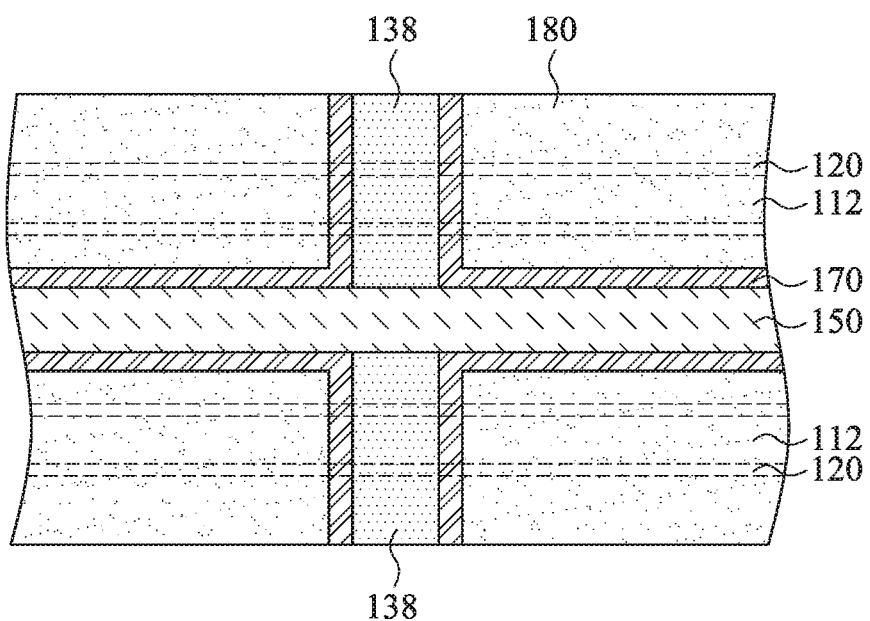

Reference is made to FIGS. 12A and 12B. A dielectric layer 180 is formed at outer sides of the gate spacers 170 on the substrate 110. The dielectric layer 180 includes silicon oxide, oxynitride or other suitable materials. The dielectric layer 180 includes a single layer or multiple layers. The dielectric layer 180 is formed by a suitable technique, such as CVD or ALD. A chemical mechanical planarization (CMP) process may be applied to remove excessive dielectric layer 180 and expose the top surface of the mask 160 to the following process.

In some embodiments, a replacement gate (RPG) process scheme is employed. Thereafter, additional processes may be performed to manufacture the semiconductor device. For example, the metal gate may be doped, portions of the metal gate may be silicided, inter-layer dielectric (ILD) layers/and inter-metal dielectric (IMD) layers may be formed, metallization layers may be formed, and the like.

Figure 13:
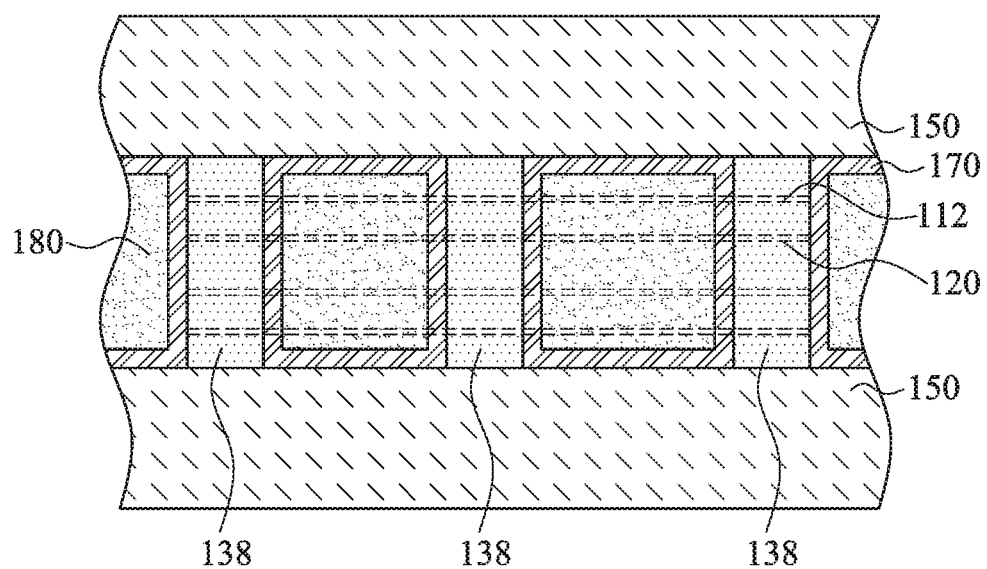
FIG. 13 is a cross-sectional view of a semiconductor device in accordance with some embodiments of the present disclosure.

FIG. 13 is a cross-sectional view of a semiconductor device in accordance with some embodiments of the present disclosure. In FIG. 13, the semiconductor device includes two insulating structures 150. A plurality of gates 138 are disposed on the same semiconductor fin(s) 112 and between the two insulating structure 150. That is, one of the insulating structures 150 is connected to the plurality of gates 138. The gate spacers 170 separate the insulating structure 150 and the dielectric layer 180. Other relevant structural details of the semiconductor device of FIG. 13 are similar to the semiconductor device of FIG. 7B or 9B, and, therefore, a description in this regard will not be repeated hereinafter.

Since the trench of the insulating structure is formed before the formation of the gates, the trench can be defined to have a long length, such that an aspect ratio of the trench is reduced, which provides large window for depositing the insulating structure. As such, the deposition of the insulating structure can be improved. Furthermore, since trench has a long length, the sidewall of the trench is substantially straight, such that the end sidewalls of the gates are substantially vertical rather than rounded. Moreover, since the aspect ratio of the trench is reduced, the critical dimension of the trench (also the insulating structure) can be reduced, which means less dielectric refilling in the trench. The configuration of the insulating structure is independent on the sizes (or the lengths) of the gates. The insulating structure can provide good isolation between the gates even the gates have smaller dimensions and avoid the gates being short.

According to some embodiments, a method for manufacturing a semiconductor device includes forming a shallow trench isolation (STI) structure surrounding a pair of semiconductor fins; forming a dummy gate layer over the ST1 structure and the semiconductor fins; etching a first portion of the dummy gate layer to form a trench through the dummy gate layer until the STI structure is exposed, in which the trench extends between the semiconductor fins along a lengthwise direction of the semiconductor fins; forming an insulating structure in the trench through the dummy gate layer; after forming the insulating structure extending through the dummy gate layer, patterning the dummy gate layer to form a pair of dummy gate structures each of which is across a respective one of the semiconductor fins; and replacing the dummy gate structures with a pair of metal gate structures.

According to some embodiments, a method for manufacturing a semiconductor device includes forming a shallow trench isolation (STI) structure surrounding a pair of semiconductor fins; forming a pair of dummy gate structures over the semiconductor fins, respectively; forming an insulating structure extending between the dummy gate structures along the lengthwise direction of the semiconductor fins; patterning the dummy gate structures such that the dummy gate structures have longest sides perpendicular to the lengthwise direction of the semiconductor fins; and replacing the dummy gate structures with a pair of metal gate structures.

According to some embodiments, a method for manufacturing a semiconductor device includes forming a dummy gate layer over a semiconductor fin; etching a first portion of the dummy gate layer to form a trench that extends through the dummy gate layer along a lengthwise direction of the semiconductor fin; forming an insulating structure in the trench; after forming the insulating structure in the trench, patterning the dummy gate layer to form a dummy gate structure extending across the semiconductor fin along a direction perpendicular to the lengthwise direction of the semiconductor fin; and replacing the dummy gate structure with a metal gate structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor device comprising:
   forming a shallow trench isolation (STI) structure surrounding a pair of semiconductor fins;
   forming a dummy gate layer over the STI structure and the semiconductor fins;
   etching a first portion of the dummy gate layer to form a trench through the dummy gate layer until the STI structure is exposed, wherein the trench extends between the semiconductor fins along a lengthwise direction of the semiconductor fins;
   forming an insulating structure in the trench through the dummy gate layer;
   after forming the insulating structure extending through the dummy gate layer, patterning the dummy gate layer to form a pair of dummy gate structures each of which is across a respective one of the semiconductor fins; and
   replacing the dummy gate structures with a pair of metal gate structures.

2. The method of claim 1, wherein the etching the first portion of the dummy gate layer to form the trench through the dummy gate layer is performed such that the trench is spaced apart from the semiconductor fins by a second portion of the dummy gate layer.

3. The method of claim 1, wherein forming the insulating structure in the trench through the dummy gate layer comprises:
   forming an insulating material in the trench and over the dummy gate layer; and
   etching back the insulating material until the dummy gate layer is exposed to form the insulating structure.

4. The method of claim 1, wherein the patterning the dummy gate layer to form the dummy gate structures comprises:
   forming a mask strip across the insulating structure and overlapping the semiconductor fins; and
   removing the dummy gate layer that is exposed by the mask strip to form the dummy gate structures.

5. The method of claim 4, wherein the insulating structure remains after the removing the dummy gate layer that is exposed by the mask strip.

6. The method of claim 4, further comprising:
   forming a gate spacer on a sidewall of one of the dummy gate structures, wherein the mask strip remains after the forming the gate spacer on a sidewall of the one of the dummy gate structures.

7. The method of claim 1, further comprising:
   forming a mask strip across the insulating structure and overlapping the semiconductor fins; and
   etching back a portion of the insulating structure exposed by the mask strip.

8. The method of claim 1, wherein the replacing the dummy gate structures with the metal gate structures is performed such that the insulating structure and the metal gate structures form a cross shape.

9. The method of claim 1, further comprising:
   forming a gate spacer on a sidewall of one of the dummy gate structures and a sidewall of the insulating structure.

10. The method of claim 1, further comprising:
    forming a gate spacer on a sidewall of one of the dummy gate structures and a top surface of the insulating structure.

11. A method for manufacturing a semiconductor device comprising:
    forming a shallow trench isolation (STI) structure surrounding a pair of semiconductor fins;
    forming a pair of dummy gate structures over the semiconductor fins, respectively;
    forming an insulating structure extending between the dummy gate structures, the insulating structure having a height extending from bottommost surfaces of the dummy gate structures to topmost surfaces of the dummy gate structures and a length extending along a lengthwise direction of the semiconductor fins;
    patterning the dummy gate structures such that the dummy gate structures have longest sides perpendicular to the lengthwise direction of the semiconductor fins; and
    replacing the dummy gate structures with a pair of metal gate structures.

12. The method of claim 11, wherein the forming the insulating structure is performed such that the insulating structure is spaced apart from the semiconductor fins.

13. The method of claim 11, wherein the forming the insulating structure is performed such that the insulating structure is in contact with the dummy gate structures.

14. The method of claim 11, wherein the forming the insulating structure is performed such that the height of the insulating structure is higher than a height of one of the semiconductor fins.

15. The method of claim 11, further comprising:
forming a gate spacer over the dummy gate structures and the insulating structure.

16. The method of claim 15, further comprising:
forming a dielectric material over the semiconductor fins and the insulating structure; and
planarizing the dielectric material until the gate spacer above the insulating structure is exposed.

17. A method for manufacturing a semiconductor device comprising:
forming a dummy gate layer over a semiconductor fin;
etching a first portion of the dummy gate layer to form a trench that extends through the dummy gate layer along a lengthwise direction of the semiconductor fin;
forming an insulating structure in the trench;
after forming the insulating structure in the trench, patterning the dummy gate layer to form a dummy gate structure extending across the semiconductor fin along a direction perpendicular to the lengthwise direction of the semiconductor fin; and
replacing the dummy gate structure with a metal gate structure.

18. The method of claim 17, wherein the forming an insulating structure is performed such that the insulating structure is spaced apart from the semiconductor fin.

19. The method of claim 17, further comprising forming a shallow trench isolation over the semiconductor fin prior to the forming the dummy gate layer.

20. The method of claim 17, further comprising forming a gate spacer extending along a sidewall of the dummy gate structure and extending along a sidewall of the insulating structure.

* * * * *